(12) United States Patent
Horng (10) Patent No.: US 7,872,878 B2
(45) Date of Patent: Jan. 18, 2011

(54) EMI SHIELDING DEVICE

(76) Inventor: Chin-Fu Horng, 4F, No. 282, Chung Shan I Rd., Lu Chou City, Taipei Hsien (TW)

( * ) Notice: Subject to any disclaimer, the term of this patent is extended or adjusted under 35 U.S.C. 154(b) by 0 days.

(21) Appl. No.: 12/574,106

(22) Filed: Oct. 6, 2009

(65) Prior Publication Data

US 2010/0020520 A1    Jan. 28, 2010

Related U.S. Application Data

(62) Division of application No. 11/705,016, filed on Feb. 12, 2007, now Pat. No. 7,633,768.

(30) Foreign Application Priority Data

Jan. 3, 2007    (TW) .............................. 96200094 U (51) Int. Cl.
*H05K 9/00* (2006.01)
(52) U.S. Cl. ...................................... 361/818; 361/816
(58) Field of Classification Search ................. 361/800, 361/816, 818, 799, 752, 730, 790, 797; 174/35 R, 174/50

See application file for complete search history.

(56) References Cited

U.S. PATENT DOCUMENTS

| 5,844,784 | A  | * | 12/1998 | Moran et al. ................. | 361/818 |
| 6,178,318 | B1 | * | 1/2001  | Holmberg et al. ........... | 455/300 |
| 6,269,008 | B1 | * | 7/2001  | Hsu ........................... | 361/816 |
| 6,570,086 | B1 | * | 5/2003  | Shimoji et al. .............. | 174/377 |
| 6,570,772 | B2 | * | 5/2003  | Kawano et al. ............. | 361/752 |
| 2004/0052064 | A1 | * | 3/2004  | Oliver et al. ................ | 361/816 |

* cited by examiner

*Primary Examiner*—Hung S Bui
(74) *Attorney, Agent, or Firm*—Rosenberg, Klein & Lee (57) ABSTRACT

An EMI shielding device is set in an electronic device. The electronic device includes a shell, a circuit board set in the shell, and an electrical component set on the circuit board. The shielding device includes a middle board and a shielding cover. The middle board is set inside the electronic device. The shielding cover is set on the middle board and covers an outside of the electrical component. Thus, the EMI shielding device is structured. The material of the shielding cover is widely used, so the cost of the material is markedly reduced. After the shielding cover is opened, it is easy to restore the shielding state. The shielding cover is set inside the electronic device via the middle board, so assembly is easy and it is not limited by changes in the shape or the structure of the shell, so applicability is improved.

5 Claims, 12 Drawing Sheets

EMI SHIELDING DEVICE

CROSS REFERENCE TO RELATED APPLICATION

This present application is a divisional application (specifically upon objects depicted in FIGS. 6-7) of U.S. application Ser. No. 11/705,016, which was filed Feb. 12, 2007 now pending. This application is incorporated in its entirety by reference herein.

BACKGROUND OF THE INVENTION

1. Field of the Invention

The present invention relates to an EMI shielding device, and more specifically to an EMI shielding device that shield s electrical components, such as a chip or a CPU, from EMI.

2. Description of the Prior Art

A shielding cover is used to shield electrical components from EMI (Electromagnetic Interference) and prevents electrical components set on the circuit board of an electronic device (such as a mobile phone, a PDA, or a computer) from the effects of EMI. The electrical component may be a chip or a CPU, etc. The shielding cover covers the outside of the electrical component set on a circuit board to shield the electrical components from EMI.

However, the shielding cover must be welded onto the circuit board by an SMT (surface mount technology) process, thus, the material of the shielding cover must be a certain welding material. However, the cost of such material is high. Moreover, when the electronic device needs to be repaired, the top board of the shielding cover must be lifted away, and another top board is needed after the repair to place the EMI shield, further increasing costs.

Hence, the inventors of the present invention believe that these shortcomings above are able to be improved upon and suggest the present invention which is of a reasonable design and is an effective improvement based on deep research and thought.

SUMMARY OF THE INVENTION

An object of the present invention is to provide an EMI shielding device, of which the material of the shielding cover is widely used, so that the cost of the material is reduced. Thereby, after the shielding cover has been opened, it is easy to restore the shielding state, and another cover doesn't need to replace the original shield.

Another object of the present invention is to provide an EMI shielding device, in which the assembling of the shielding cover is easy, the surface of which is flat, and which is not limited by changes in the shape or the structure of the shell, so applicability is improved.

To achieve the above-mentioned objects, an EMI shielding device is disclosed. The shielding device is set in an electronic device and comprises a shell, a circuit board set in the shell, and an electrical component set on the circuit board. The shielding device comprises a middle board and a shielding cover. The middle board is set inside the electronic device and the shielding cover is set on the middle board and covers the outside of the electrical component.

The advantages of the present invention are that the shielding cover of the present invention doesn't need to be welded on the circuit board; the material of the shielding cover is widely used, so the material's cost is reduced; to repair the electrical component, the middle board and the circuit board can be separated to open the shielding cover; after repairing, the middle board can be fixed inside the electronic device to cover the shielding cover over the electrical component to restore the shield. Moreover, the shielding cover is set inside the electronic device by the middle board, so assembly is easy, the surface is flat, and the shield is not limited by changes in the shape or the structure of the shell, so applicability is improved.

To further understand the features and technical contents of the present invention, please refer to the following detailed description and drawings related to the present invention. However, the drawings are only to be used as references and explanations, and not to limit the present invention.

DETAILED DESCRIPTION OF THE INVENTION

Figure 1:
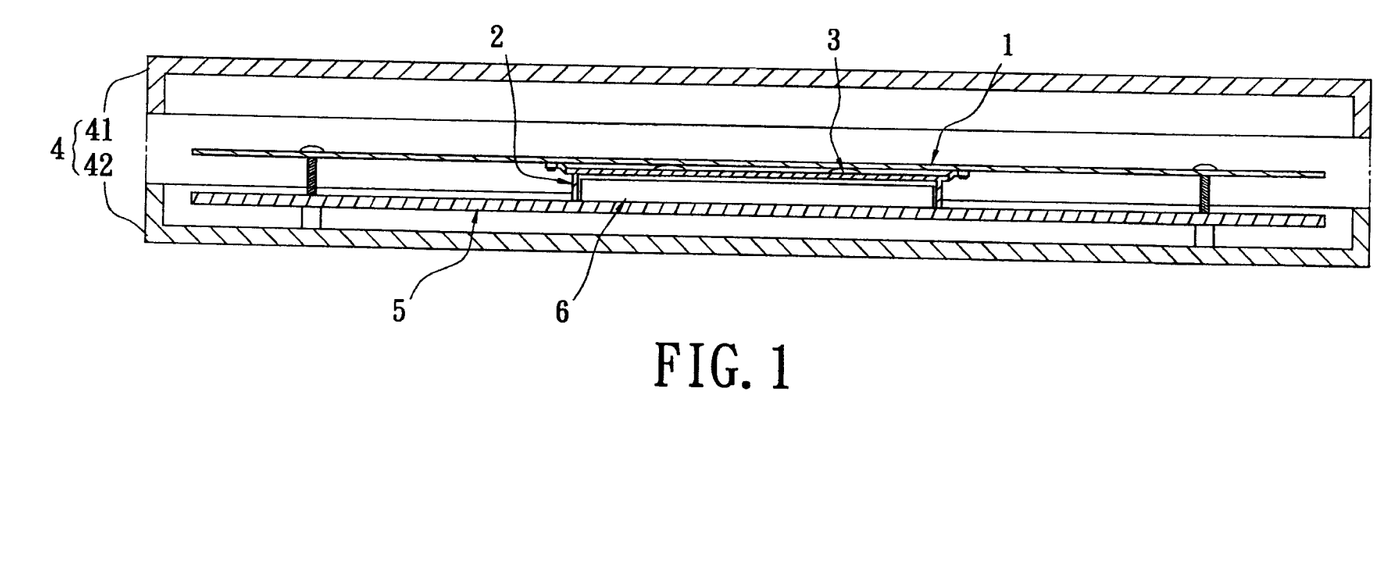
FIG. 1 is a plan view of a first embodiment of the present invention.
Figure 2:
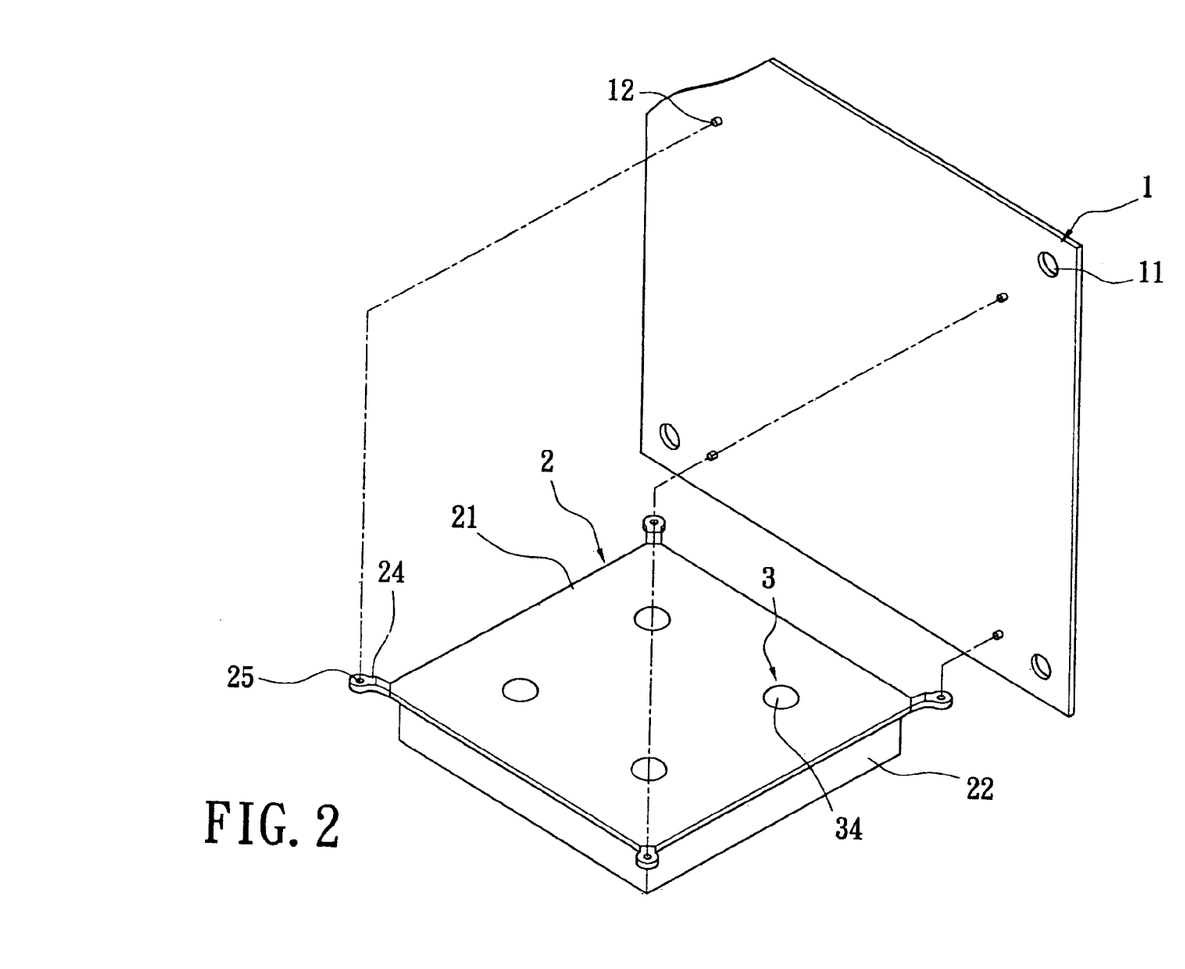
FIG. 2 is an explored isometric view of the first embodiment of the present invention.
Figure 3:
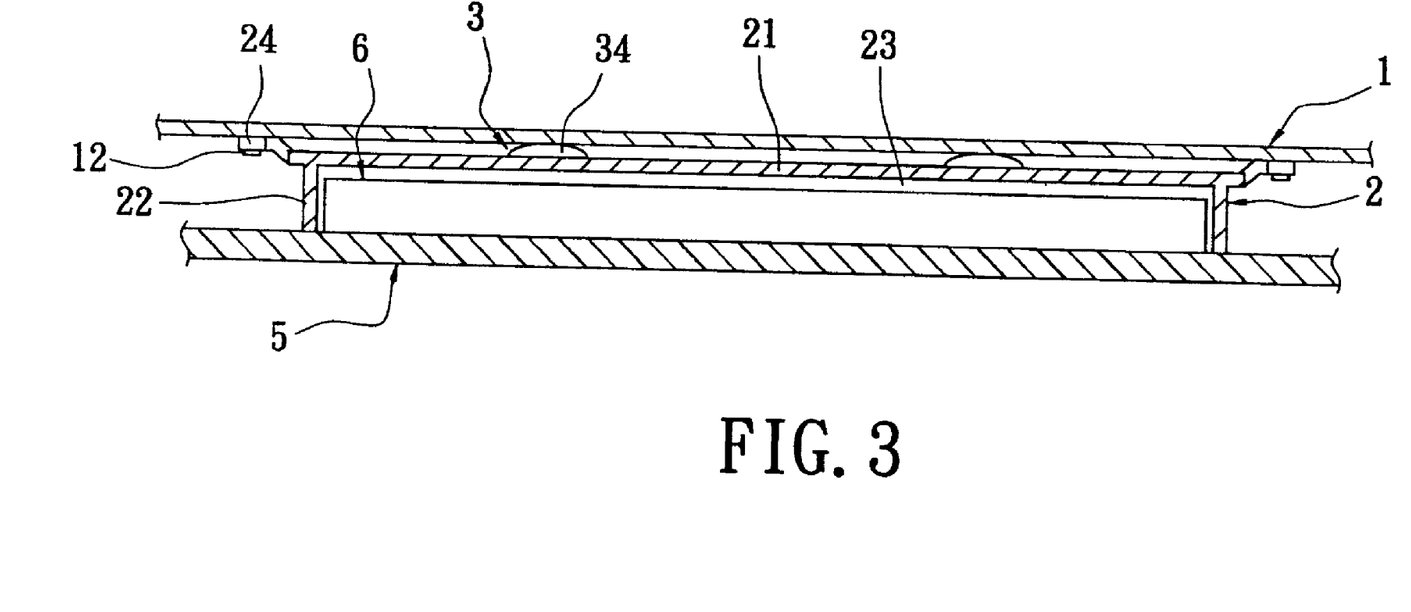
FIG. 3 is a cutaway view of the first embodiment of the present invention.

Referring to FIGS. 1-3, an EMI shielding device of the present invention is set in an electronic device, the device's number being unlimited. The electronic device includes a shell 4 and a circuit board 5 set in the shell 4 and an electrical component 6 set on the circuit board 5. The shell 4 includes an upper shell 41 and a lower shell 42. The upper shell 41 and the lower shell 42 are assembled or opened by catches or locking screws. The shielding device includes a middle board 1, a shielding cover 2, and a spring component 3. The middle board 1 is made of metal, rubber or other materials. The middle board 1 is also known as an inner board. The shape of the middle board is unlimited. A plurality of fixing holes 11 are set on the edge of the middle board 1 to fix the locking screws inside the electronic device. The middle board 1 is locked onto the circuit board 5 or the shell 4.

The middle board 1 of the embodiment is fixed on the circuit board 5 or the shell 4 via locking screws, but the fixing method is unlimited. The middle board 1 of the embodiment is fixed on the circuit board 5 or the shell 4 inside the electronic device by methods such as hot melting, riveting, spot welding, clamp-jointing or screw-jointing, etc. A plurality of connectors 12 are set on the middle board 1, and the plurality of connectors 12 are in-molded on the middle board 1 or assembled thereon. In the present embodiment, the connectors 12 are made of hot-melting material.

The shielding cover 2 is made of metal and is cube-shaped and empty inside, however the shielding cover 2 can be any other shape. The shielding cover 2 includes a top board 21 and side boards 22 extending downwards around the edge of the top board 21. The top board 21 and the side boards 22 form a containing space 23. The containing space 23 is inside the shielding cover 2 and can contain an electrical component 6. The shielding cover 2 covers the electrical component 6.

Protruding flanges 24 extend outwards from four angles of the top board 21. Each protruding flange 24 defines a connecting hole 25 thereon. Each connector 12 can be inserted into the corresponding connecting hole 25. The connectors 12 and the connecting holes 25 are fixed and joined by hot-melting to make the shielding cover 2 join the middle board 1 corresponding to the electrical component 6. The jointing method of the shielding cover 2 and the middle board 1 is hot-melting, but the middle board can also be riveted, spot welded, clamp-jointed or screw-jointed, etc. The jointing methods are unlimited.

A plurality of protruding points 34 are defined on the top board 21 of the shielding cover 2 by punching thereon to form a spring component 3. The protruding points 34 protrude out of the top board 21 and sustain the bottom of the middle board 1 to press down the shielding cover 2 befittingly. Thus, the bottom edge of the shielding cover 2 can sustain the topside of the circuit board 5 elastically to join the shielding cover 2 and the circuit board 5 firmly.

When the shell 4 is assembled and the middle board 1 is fixed inside the electronic device, the shielding cover 2 set on the middle board 1 covers an outside of the electrical component 6. Thus, the EMI effect on the operation of the electrical component 6 can be prevented by the shielding of the shielding cover 2. The EMI shielding device of the present invention is formed by the structure.

To repair the electrical component 6, the shell 4 of the electronic device is opened to separate the middle board 1 and the circuit board 5. The shielding cover 2 comes apart with the electrical component 6. Thus, the electrical component 6 is easy to open and repairing is convenient. After repairing, the middle board 1 is fixed inside the electronic device to make the shielding cover 2 cover the electrical component 6 thereby restoring the shielding state.

Figure 4:
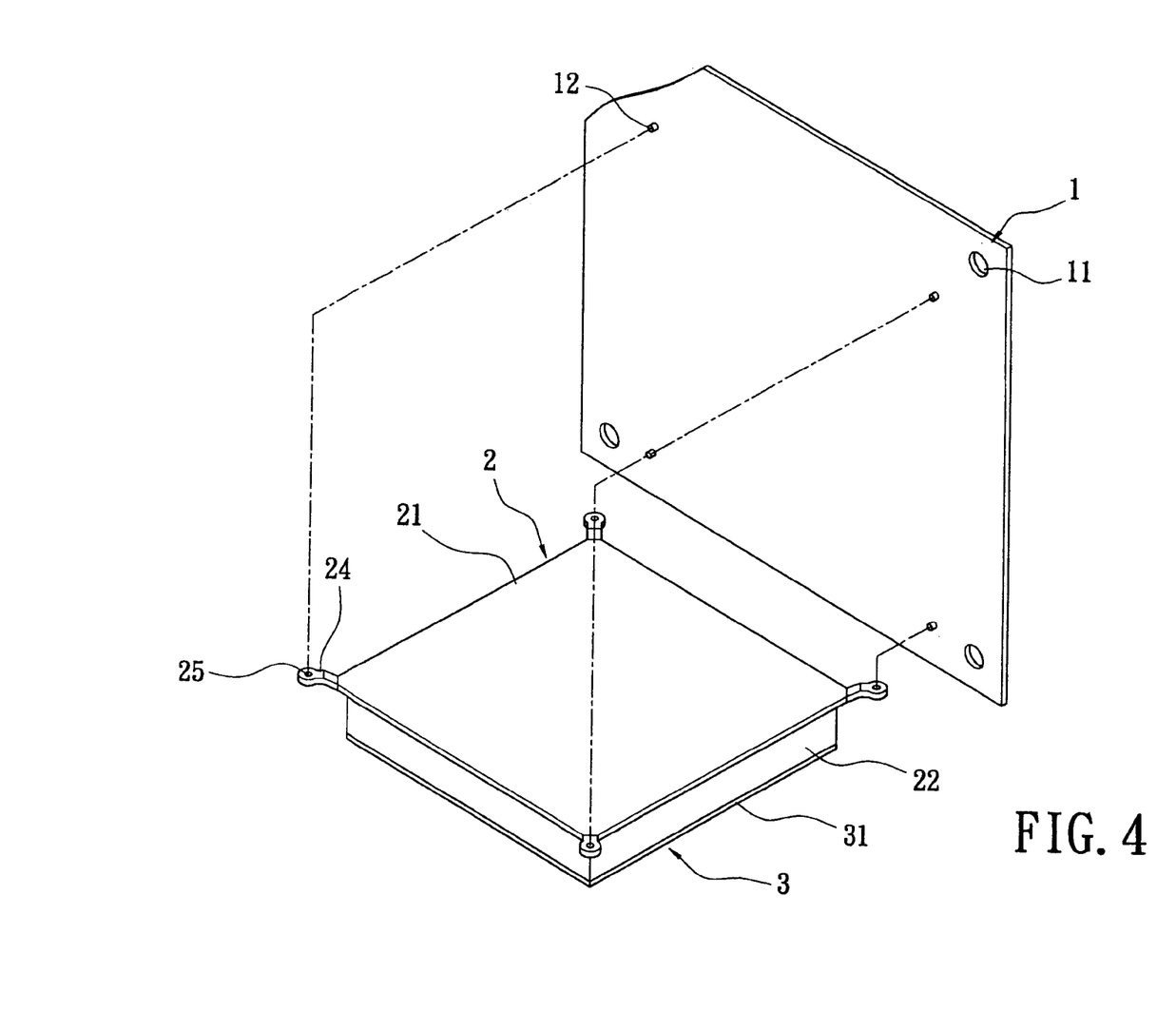
FIG. 4 is an explored isometric view of a second embodiment of the present invention.
Figure 5:
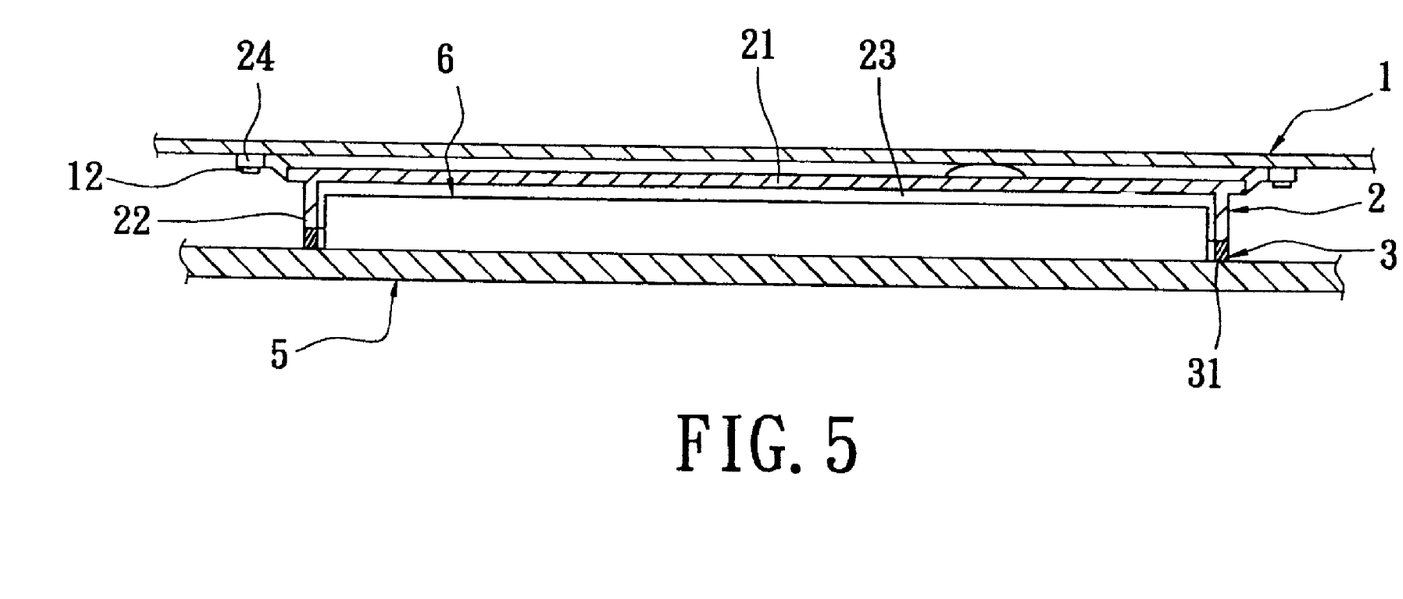
FIG. 5 is a cutaway view of the second embodiment of the present invention.

Referring to FIGS. 4 and 5, the spring component 3 of the embodiment contacts the bottom edge of the side boards 22 of the shielding cover 2. The spring component 3 and the bottom edge of the side boards 22 of the shielding cover 2 are in-molded or assembled. For the preferred embodiment, the spring component 3 is a rubber component 31. When the middle board 1 is fixed inside the electronic device, the shielding cover 2 covers the electrical component 6. The rubber component 31 is then injected with glue to join the bottom edge of the side boards 22 of the shielding cover 2. The rubber component 31 is set between the bottom edge of the side boards 22 of the shielding cover 2 and the circuit board 5 to join the shielding cover 2 and the circuit board 5 together firmly. Thus, the EMI effect on the operation of the electrical component 6 can be prevented by the shielding of the shielding cover 2.

To repair the electrical component 6, the shell 4 of the electronic device is opened to separate the middle board 1, the shielding cover 2, the circuit board 5 and the spring component 3. The shielding cover 2 is separated from the electrical component 6. Thus, the electrical component 6 is easy to open and repairing is convenient. After repairing, the middle board 1 is fixed inside the electronic device to make the shielding cover 2 cover the electrical component 6 to restore the shielding state.

Figure 6:
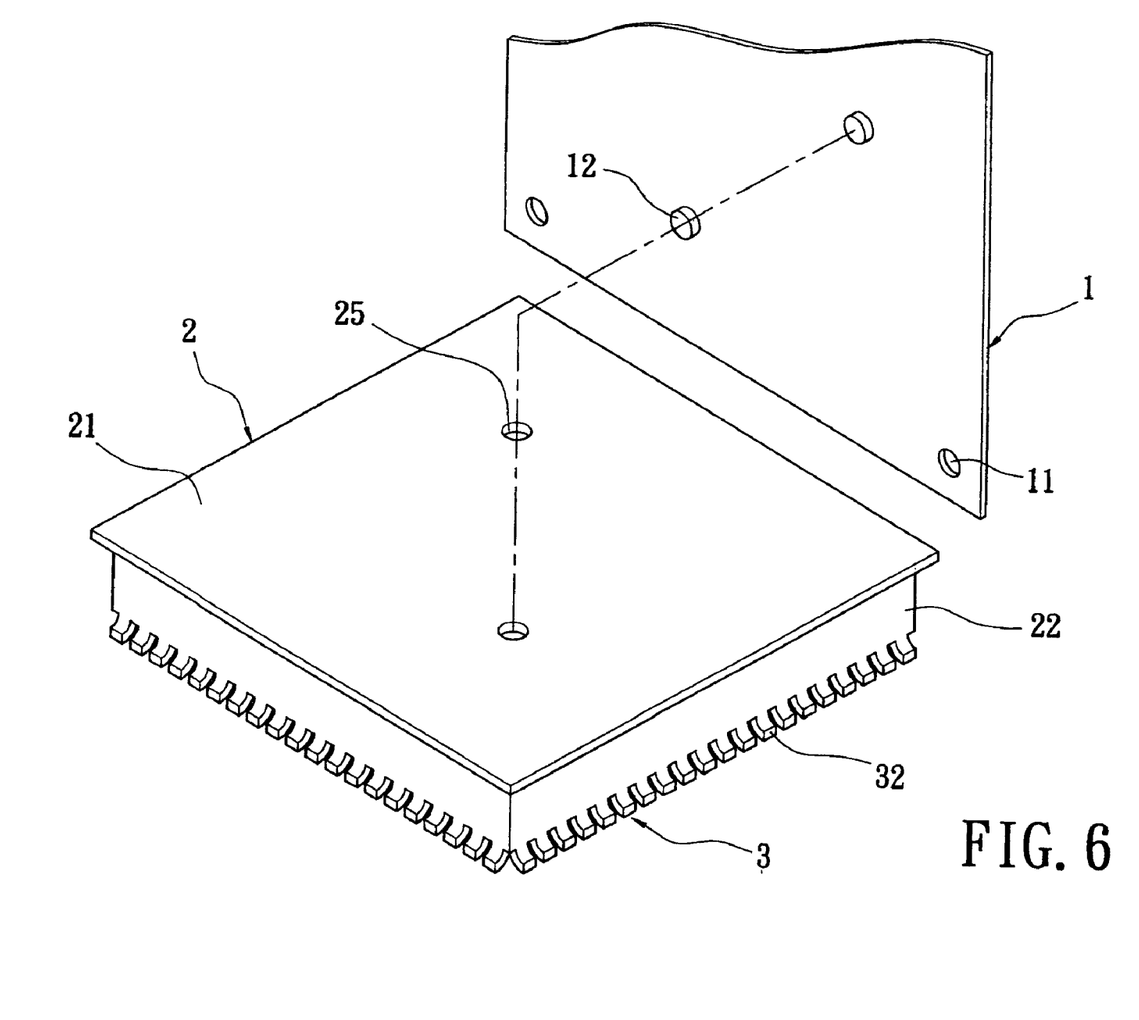
FIG. 6 is an explored isometric view of a third embodiment of the present invention.
Figure 7:
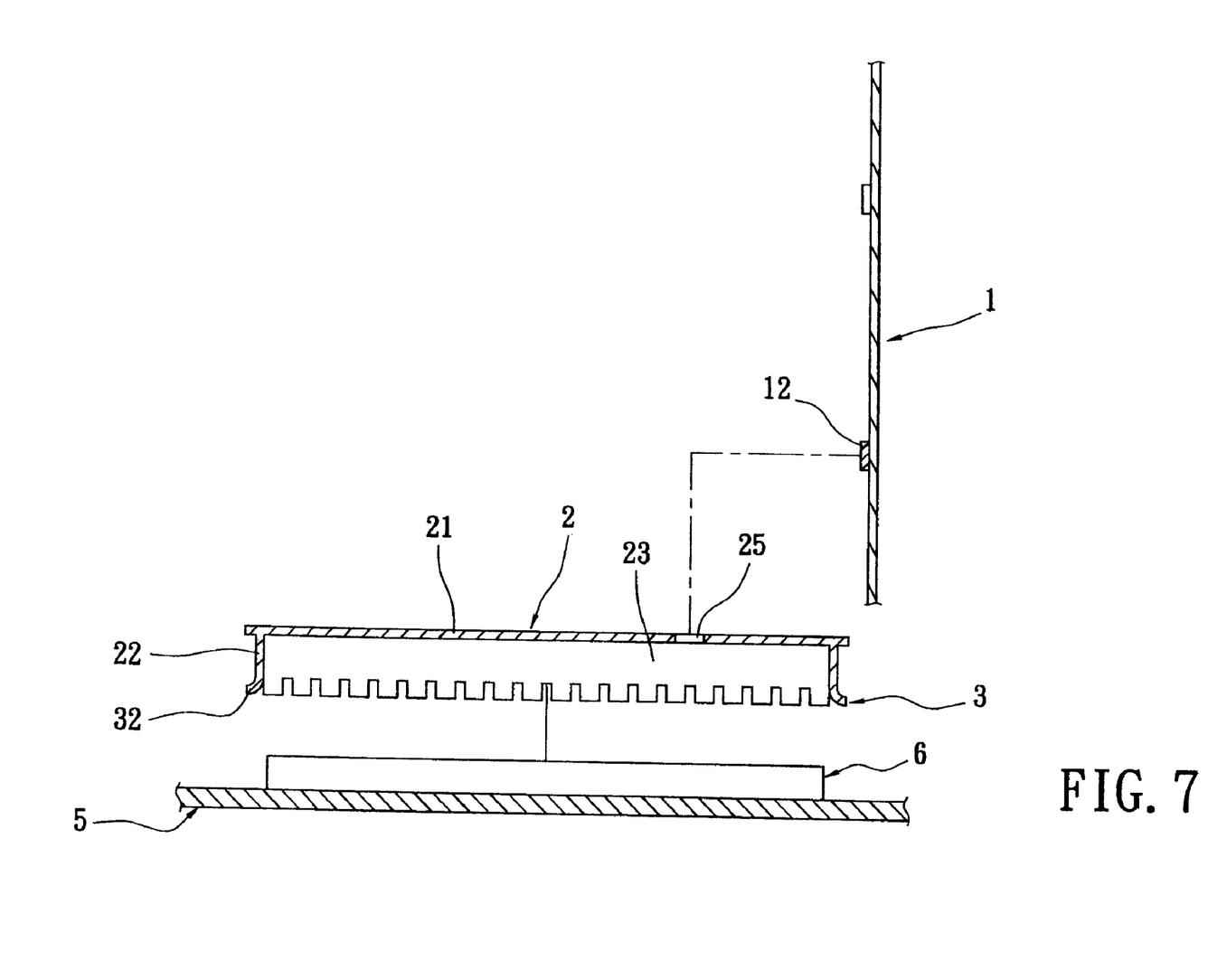
FIG. 7 is a cutaway view of the third embodiment of the present invention.
Figure 8:
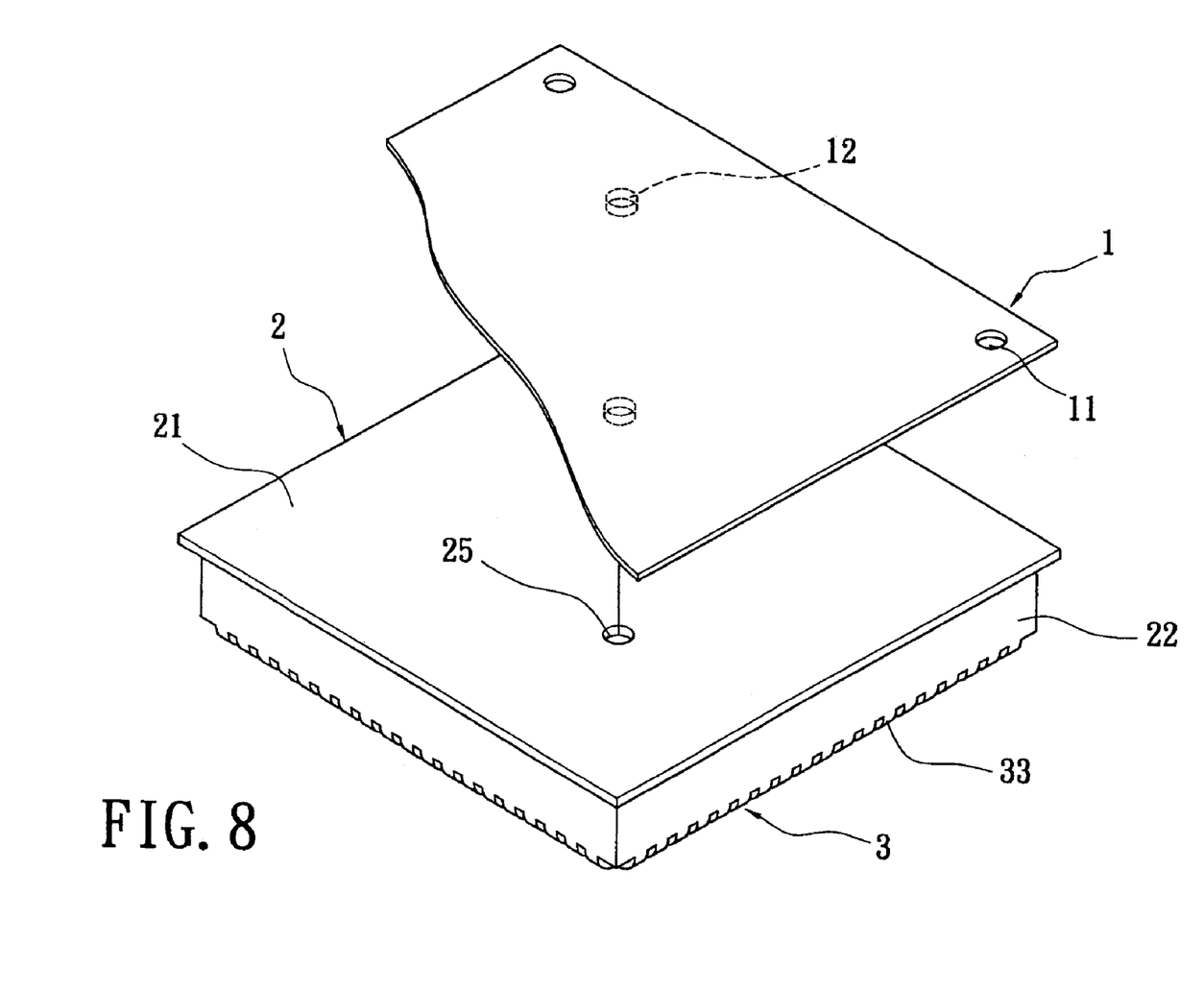
FIG. 8 is an explored isometric view of a fourth embodiment of the present invention.
Figure 9:
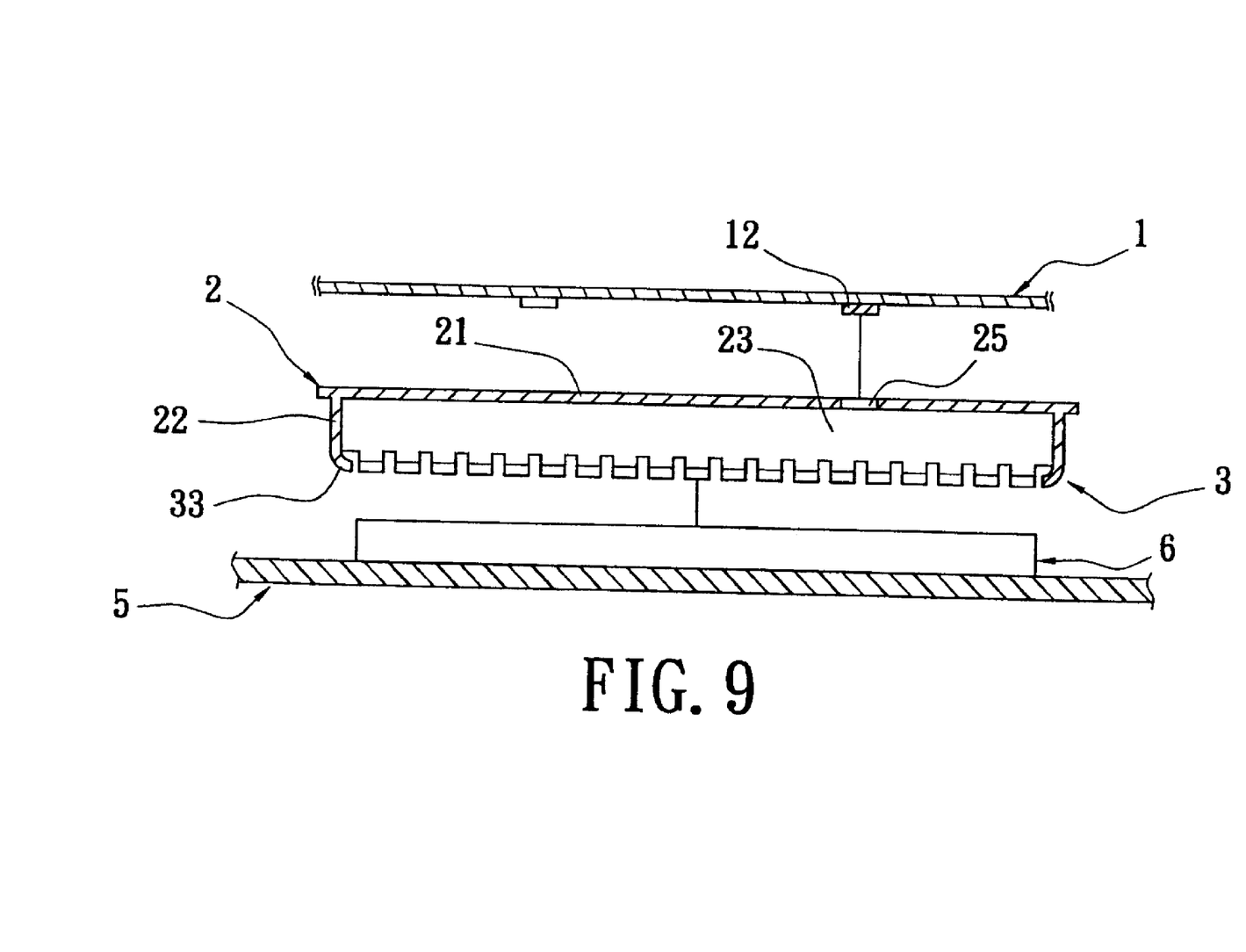
FIG. 9 is a cutaway view of the fourth embodiment of the present invention.

Please refer to FIGS. 6-9. The connecting holes 25 of the preferred embodiment are defined on the top of the shielding cover 2, that is, the connecting holes 25 are defined on the top board 21 of the shielding cover 2. The connectors 12 and the connecting holes 25 are fixed and joined by hot-melting to make the shielding cover 2 join the middle board 1 corresponding to the electrical component 6. The spring component 3 of the embodiment is a plurality of spring plates 32 and 33 in-molded on the bottom edge of the side boards 22 of the shielding cover 2. The spring plate 32 extends and bends outwards (as shown in FIGS. 6 and 7), the spring plate 33 extends and bends inwards (shown as FIGS. 8, 9). When the middle board 1 is fixed inside the electronic device, the shielding cover 2 covers the electrical component 6. The spring plates 32, 33 sustain elastically the top of the circuit board 5, and the spring plates 32, 33 are set between the bottom edge of the side boards 22 of the shielding cover 2 and the circuit board 5 to join the shielding cover 2 and the circuit board 5 firmly.

Figure 10:
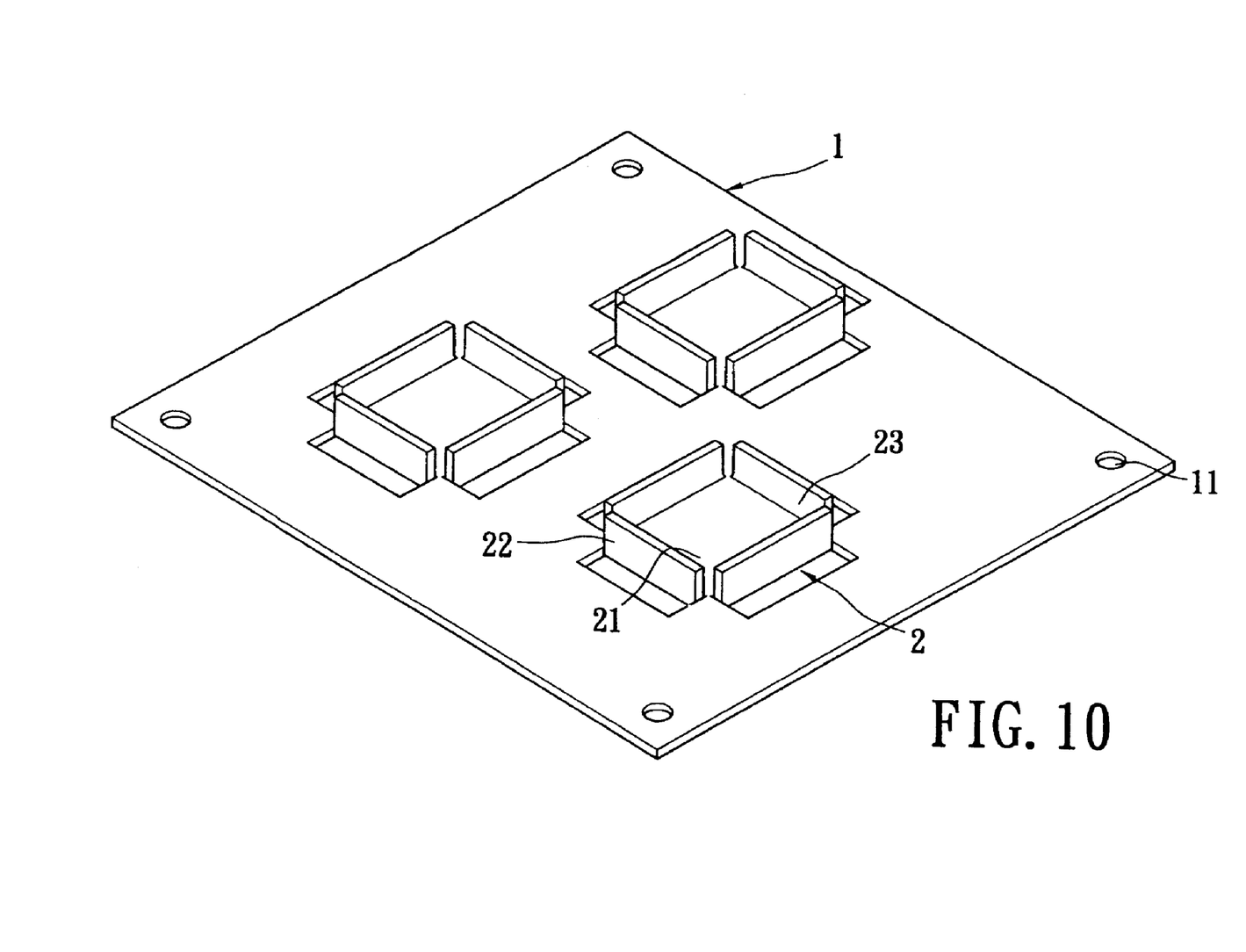
FIG. 10 is an isometric view of a fifth embodiment of the present invention.

Referring to FIG. 10, the middle board 1 and the shielding cover 2 are in-molded, that is, the top board 21 of the shielding cover 2 is in-molded onto the middle board 1. Four side boards 22 extend downwards around the edge of top board 21 by punching on the middle board 1. The top board 21 and the side boards 22 form a containing space 23. The middle board 1 and the shielding cover 2 are in-molded, and a plurality of shielding covers 2 can be set upon the middle board 1. Such a design reduces material usage, makes assembly convenient, and lowers costs.

Figure 11:
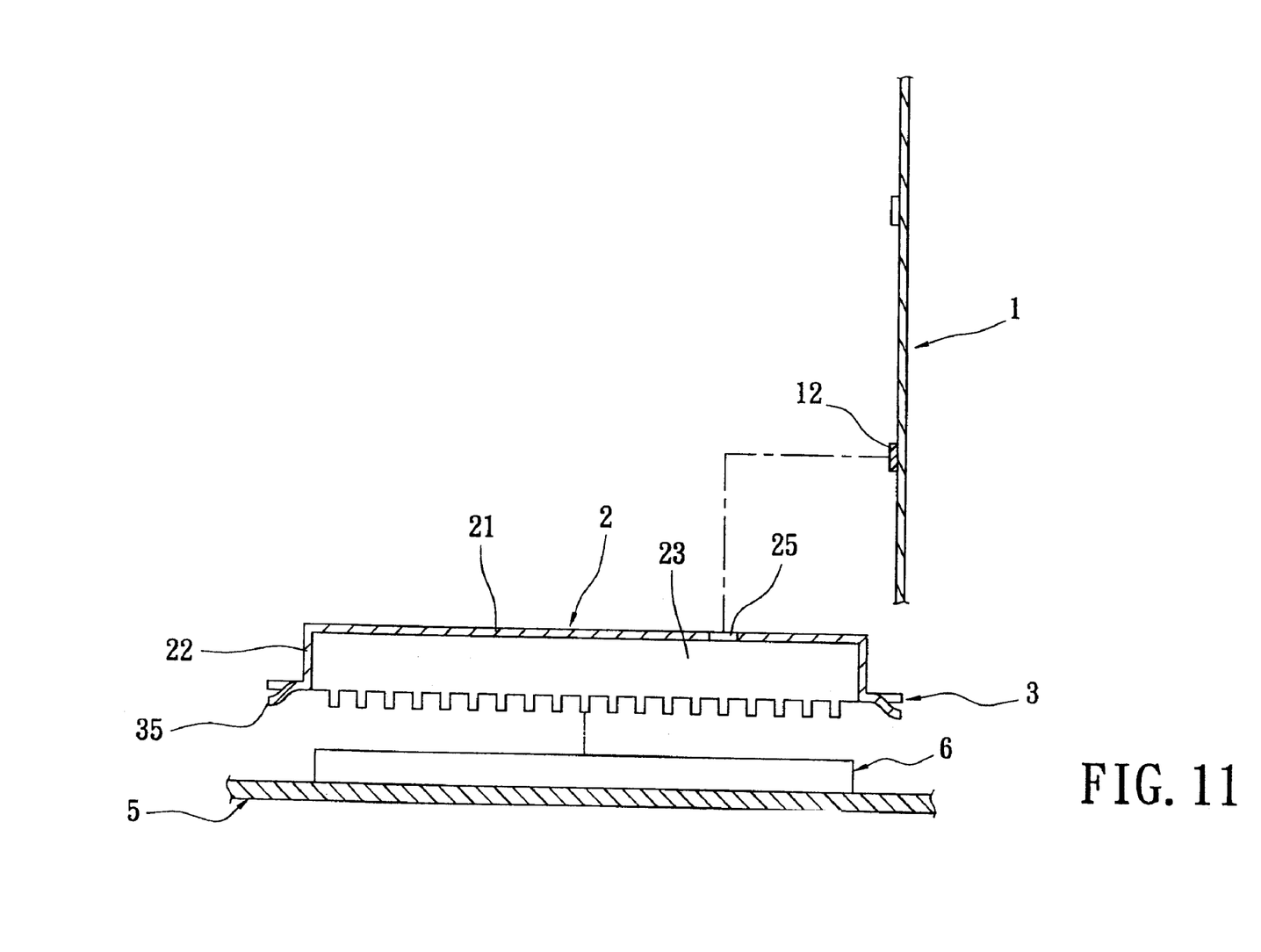
FIG. 11 is a cutaway view of a sixth embodiment of the present invention.
Figure 12:
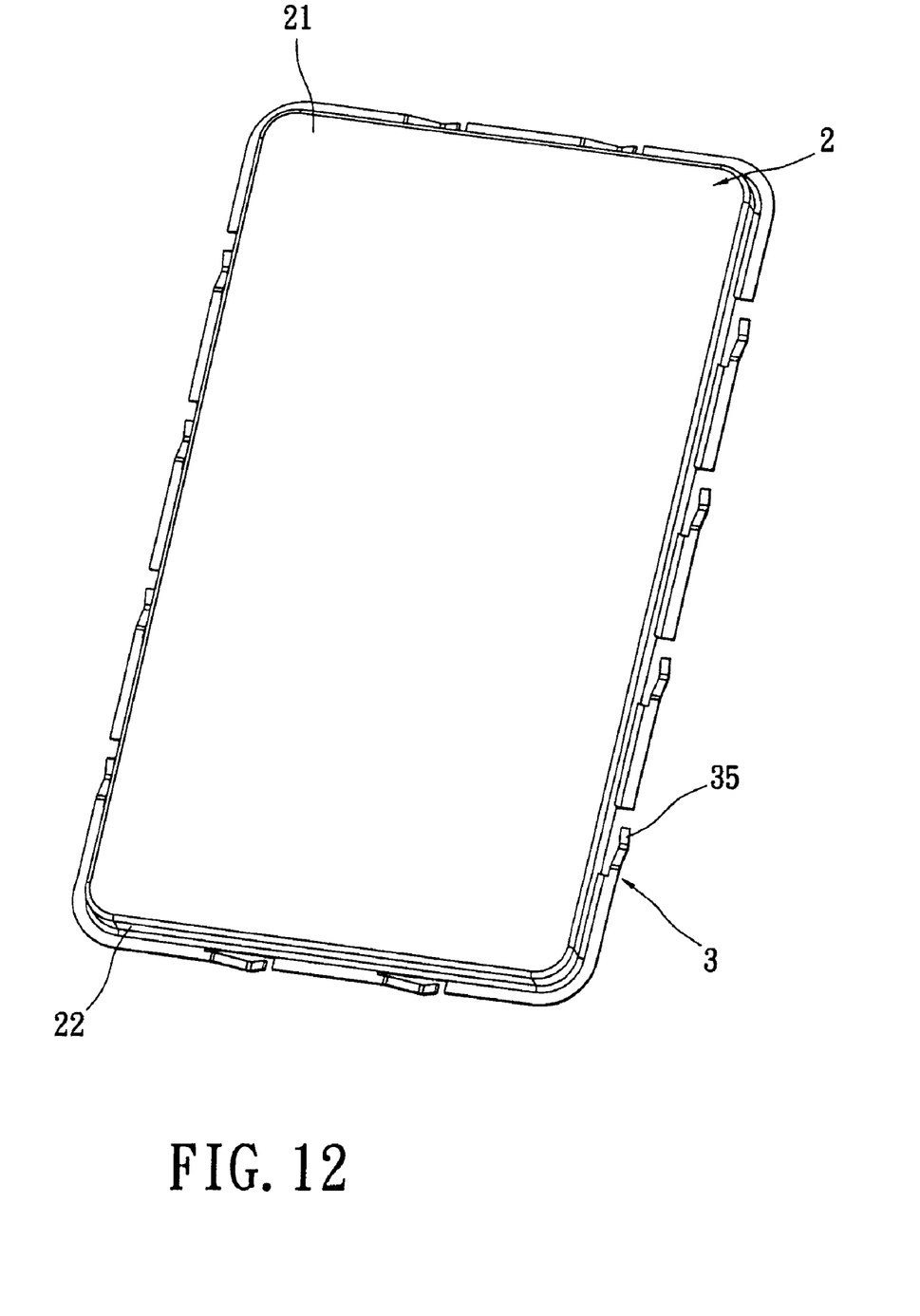
FIG. 12 is an isometric view of a shielding cover of a seventh embodiment of the present invention.

Referring to FIGS. 11 and 12, the spring component 3 of the embodiment is a plurality of spring bodies 35. The spring bodies 35 contact the bottom edge of the side boards 22 of the shielding cover 2. The bottom edge of the side boards 22 of the shielding cover 2 extends and bends outwards. The spring bodies 35 are set at the extending and bending point of the side boards 22. The spring bodies 35 sustain the top of the circuit board 5 elastically.

Consequently, the shielding cover 2 of the present invention doesn't need to be welded on the circuit board 5 by a process of SMT. The material of the shielding cover 2 is widely used, so the cost of the material is markedly reduced. Moreover, to repair the electrical component 6, the shell 4 is opened to separate the middle board 1, the shielding cover 2 and the circuit board 5 to make the shielding cover 2 open. After repairing, the middle board 1 is fixed inside the electronic device to make the shielding cover 2 cover the electrical component 6 to restore shielding. Shielding is restored easily and another cover isn't required.

Also worth mentioning is that the shielding cover 2 of the present invention is set inside the electronic device by the middle board 1. The middle board 1 can also be locked on the circuit board 5 or the shell 4. Assembling is therefore easy, surface flatness of the middle board 1 is maintained and the is shielding cover 2 is locked on the shell 4 indirectly, so as not to be limited by changes in the shape or the structure of the shell 4, thereby improving applicability.

What is disclosed above are only the preferred embodiments of the present invention, and therefore it is intended that the present invention not be limited to the particular embodiment disclosed. It should be understood by those skilled in the art that various equivalent changes may be made depending on the specification and the drawings of present invention without departing from the scope of the present invention.

What is claimed is:

1. An EMI shielding device, set in an electronic device, the electronic device comprising a shell, a circuit board set inside the shell and an electrical component set on the circuit board inside the shell, the shielding device comprising:
- a middle board located inside the shell, fixed on the circuit board via a plurality of locking screws;
- a shielding cover located between the middle board and the circuit board and engaged firmly with the middle board, further having a plurality of side boards extending downward to circulate the electrical component on the circuit board; the side boards having respective bottom edges close to the circuit board; and
- a plurality of spring plates in-molded on the bottom edges to contact elastically a top of the circuit board, each of the spring plates extending and bending outwards with respect the electrical component.

2. The EMI shielding device as claimed in claim 1, wherein said middle board defines a plurality of connectors thereon to engage fixedly with corresponding connecting holes located at said shielding cover.

3. The EMI shielding device as claimed in claim 1, wherein said middle board is fixed in said electronic device by a predetermined method selected from the group of melting, riveting, spot welding, clamp-jointing, and screw-jointing.

4. The EMI shielding device as claimed in claim 1, wherein said middle board is fixed on said shell.

5. The EMI shielding device as claimed in claim 1, wherein said shielding cover is made of metal.

* * * * *